United States Patent [19]

Yoshizawa

[11] Patent Number: 4,994,885
[45] Date of Patent: Feb. 19, 1991

[54] BIDIRECTIONAL TRIODE THYRISTOR

[75] Inventor: Yutaka Yoshizawa, Sakado, Japan

[73] Assignee: Sanken Electric Co., Ltd., Saitama, Japan

[21] Appl. No.: 370,385

[22] Filed: Jun. 22, 1989

[30] Foreign Application Priority Data

Jul. 1, 1988 [JP] Japan .............................. 63-164357
Oct. 18, 1988 [JP] Japan .............................. 63-263532

[51] Int. Cl.$^5$ ........................................ H01L 29/747
[52] U.S. Cl. ........................................ 357/39; 357/38
[58] Field of Search ............................ 357/39, 38

[56] References Cited

U.S. PATENT DOCUMENTS 3,739,242 6/1973 Foster .............................. 317/235
4,430,663 2/1984 D'Altroy et al. ................. 357/39
4,641,175 2/1987 Shiraishi .......................... 357/39

FOREIGN PATENT DOCUMENTS 4517253 6/1970 Japan .............................. 357/39 E
59-155963 9/1984 Japan .............................. 357/39
61-230369 10/1986 Japan .............................. 357/39
2019650 10/1979 United Kingdom ............ 357/38 A Primary Examiner—Rolf Hille
Assistant Examiner—Steven Loke
Attorney, Agent, or Firm—Woodcock, Washburn, Kurtz, Mackiewicz & Norris

[57] ABSTRACT

A Triac comprising a semiconductor body having several regions of two opposite conductivity types, a first main electrode and a gate electrode on one major surface of the semiconductor body, and a second main electrode on the opposite major surface of the semiconductor body. The semiconductor body has an internal first n-type region between a first p-type region, exposed at the one major surface of the body, and a second p-type region exposed at the opposite major surface of the body. The first main electrode contacts the first p-type region and a second n-type region formed therein. The gate electrode contacts a third n-type region also formed in the first p-type region. Additionally, instead of contacting the first p-type region itself, the gate electrode contact a peninsular or insular portion of the first p-type region filling a corresponding recess in the third n-type region. This arrangement reduces the magnitude of the trigger current flowing between first main electrode and gate electrode, with the consequent enhancement of a triggering sensitivity.

11 Claims, 9 Drawing Sheets

4,994,885

BIDIRECTIONAL TRIODE THYRISTOR

BACKGROUND OF THE INVENTION

My invention relates to thyristors in general and, in particular, to a bidirectional triode thyristor known as the Triac (trademark owned by the General Electric Company). More particularly, my invention pertains to such a thyristor of improved trigger characteristics.

The Triac has found widespread use as an alternating-current (a.c.) power switch in electronic circuits such as those for motor control. U.S. Pat. No. 3,739,242 to Foster represents a known Triac configuration designed for a high triggering sensitivity. For the achievement of a high triggering sensitivity, Foster teaches to provide two peninsular portions of n-type regions defining an elongate portion of a p-type region therebetween.

I object to this and comparable prior art Triac constructions because the width of the elongate p-type portion cannot possibly be reduced indefinitely by reason of the requirement for electrical separation between the two n-type regions. Thus, as there is a limit to the reduction of the width of the elongate p-type portion, so there has been a limit to a degree of triggering sensitivity attainable.

SUMMARY OF THE INVENTION

I have hereby invented how to enhance the triggering sensitivity of the Triac at low trigger currents while assuring electrical separation among its constituent semiconductor regions. I have also discovered how to achieve a high triggering sensitivity and, at the same time, how to reduce the temperature dependence of triggering action to a minimum.

In summary, the improved Triac of my invention includes a semiconductor body comprised of several regions of two opposite conductivity types (i.e. p- and n-type regions), and two main current-carrying electrodes and a gate electrode on the semiconductor body. The regions of the semiconductor body include: a first region of a first conductivity type within the body; a second region of a second conductivity type, opposite to the first conductivity type, contiguously disposed on a first side of the first region and exposed at a first surface of the body; a third region of the second conductivity type contiguously disposed on a second side, opposite to the first side, of the first region and exposed at a second surface, opposite to the first surface, of the body; a fourth region of the first conductivity type formed in the third region and exposed at the second surface of the body; a fifth region of the first conductivity type formed in the third region and isolated from the fourth region, the fifth region being exposed at the second surface of the body; and a sixth region of the first conductivity type formed in the second region and exposed at the first surface of the body. The fifth region has a recess extending therethrough in a direction normal to the first and second opposite surfaces of the semiconductor body. This recess is filled by a filling portion of the third region. Formed on the second surface of the semiconductor body, one of the main electrodes contacts the third and fourth regions. The other main electrode is formed on the first surface of the semiconductor body and contacts the second and sixth regions. The gate electrode, also formed on the second surface of the semiconductor body, contacts the fifth region and the filling portion of the third region.

The gate trigger current flowing between the first main electrode and the gate electrode consists largely of a first component flowing through the third region under the fifth region, and a second component flowing through the surface portion of the third region. According to my invention summarized above, the filling portion of the third region, which may be either peninsular or insular in shape as seen on the second surface of the semiconductor body, serves to increase the resistance of the surface portion of the third region and hence to decrease the magnitude of the second component of the trigger current. Consequently, as the total trigger current is thus reduced, a high triggering sensitivity is achieved. The filling portion is wholly surrounded by the fifth region, so that it does not affect electrical separation between the fourth and fifth regions.

A further feature of my invention resides in a resistive region of a negative temperature coefficient interconnecting the first main electrode and the gate electrode. This resistive region functions to reduce the temperature dependence of the high triggering sensitivity attained.

The above and other features and advantages of my invention and the manner of realizing them will become more apparent, and the invention itself will best be understood, from a study of the following description and appended claims, with reference had to the attached drawings showing the closest prior art and some preferred embodiments of my invention.

DETAILED DESCRIPTION

I believe that my invention will be better understood when taken in comparison with the closest prior art device. I have therefore illustrated such known Triac in FIGS. 1-4. It has a semiconductor body 1 of silicon of square outline. As best revealed by FIG. 1, the semiconductor body 1 has an inner n-type region $n_1$ (hereinafter referred to as $n_1$-region), a p-type region $p_1$ (hereinafter referred to as the $p_1$-region) contiguously underlying the $n_1$-region and exposed at the bottom of the body, and another p-type region $p_2$ (hereinafter referred to as the $p_2$-region) contiguously overlying the $n_1$-region and exposed at the top of the body. The $n_1$-region is formed by the start material, silicon, of the semiconductor body 1 itself. The $p_1$-region and $p_2$-region are both formed by the diffusion of an impurity substance such as boron from the opposite surfaces of the body. The $p_2$-region is surrounded by the $n_1$-region.

As shown also in FIG. 2, there are formed in parts of the $p_2$-region a further n-type region $n_2$ (hereinafter referred to as the $n_2$-region) and a yet further n-type region $n_4$ (hereinafter referred to as the $n_4$-region). The $n_2$-region and $n_4$-region are formed by diffusion of an impurity substance such as phosphorus and are exposed at the top of the body 1.

Figure 1:
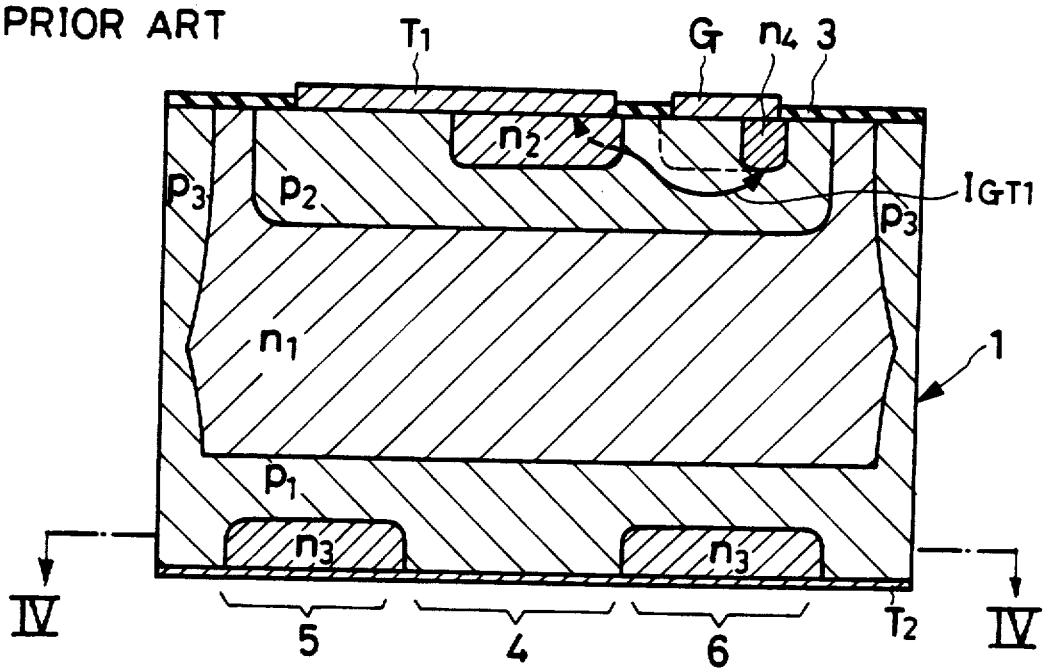
FIG. 1 is a sectional illustration of the prior art Triac, the section being taken along the line I—I in FIGS. 2, 3 and 4.
Figure 4:
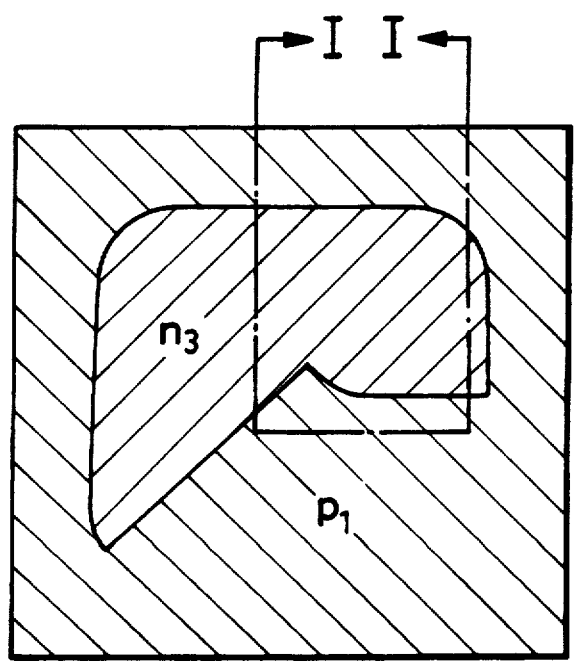
FIG. 4 is a section through the prior art Triac, taken along the line IV—IV in FIG. 1.

FIGS. 1 and 4 reveal an additional n-type region $n_3$ (hereinafter referred to as the $n_3$-region) formed in part of the $p_1$-region by the diffusion of an impurity substance such as phosphorus. It will also be noted from FIGS. 1 and 2 that an additional p-type region $p_3$ (hereinafter referred to as the $p_3$-region) is formed around the $n_1$-region. This $p_3$-region is formed so as to reach the $p_1$-region by the diffusion of boron or the like from the opposite sides of the semiconductor wafer before it is cut into individual dice.

Figure 2:
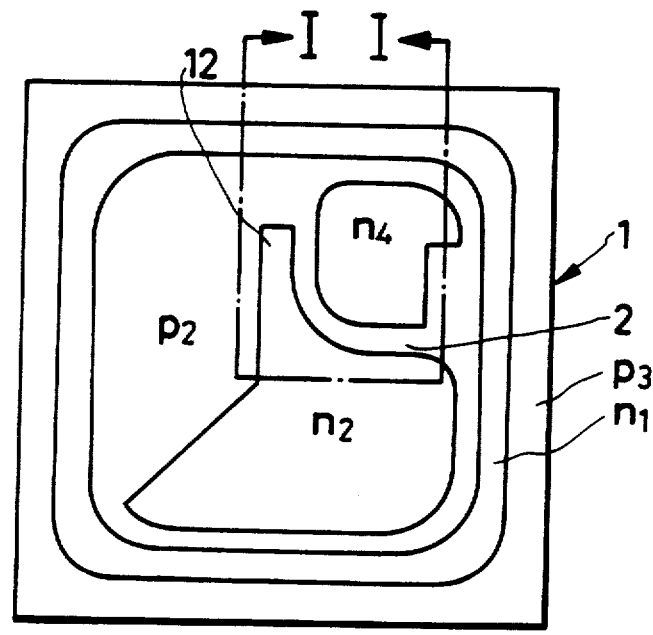
FIG. 2 is a top plan of the semiconductor body of the prior art Triac.

A consideration of FIG. 2 will show that both the $n_1$-region and the $p_2$-region are approximately square shaped as seen in a plan view as in the figure. The exposed surface area of the $n_2$-region is approximately one third of that of the $p_2$-region. The exposed surface area of the $n_4$-region is as small as approximately one eighth of that of the $p_2$-region. This prior art Triac is referred to as the corner gate type, with the $n_4$-region being disposed adjacent one corner of the $p_2$-region which is approximately rectangular in shape as seen on the top surface of the semiconductor body 1.

It will also be noted from FIG. 2 that the $n_2$-region and the $n_4$-region are so shaped and arranged as to provide an elongate portion 2 of the $p_2$-region therebetween. The $n_2$-region has a peninsular portion 12 extending along part of the boundary of the $n_4$-region to provide the elongate portion 2 of the $p_2$-region.

FIG. 4 indicates that the $n_3$-region is formed in part of the $p_1$-region. The $n_3$-region partly laps over the $n_4$-region as seen from either the top or bottom of the body 1.

Figure 3:
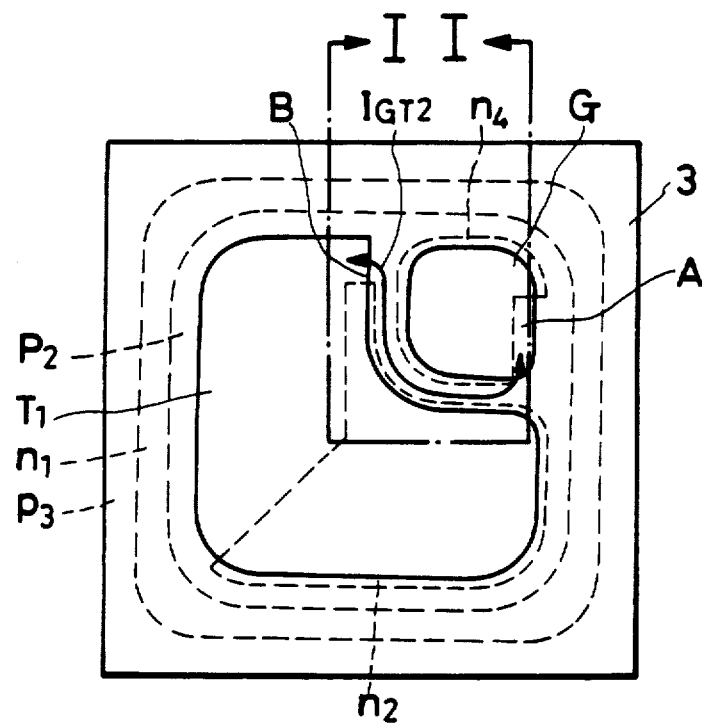
FIG. 3 is a top plan of the prior art Triac.

FIGS. 1 and 3 show a first main electrode $T_1$, a second main electrode $T_2$ and a gate electrode G on the semiconductor body 1. Fabricated by vacuum deposition of aluminum on the top of the body 1, the first main electrode $T_1$ overlies most parts of the $p_2$-region and $n_2$-region. The second main electrode $T_2$ is formed by vacuum deposition of titanium and nickel on the bottom of the body 1 so as to be in direct contact with the $p_1$-region and the $n_3$-region. The gate electrode G, also formed by vacuum deposition of aluminum on the top of the body 1, makes direct contact with most of the $n_4$-region and with part of the $p_2$-region. The first main electrode $T_1$ and gate electrode G make contact with the noted regions through openings in an insulating film 3 covering the top of the body 1. The insulating film 3 may be composed principally of silicon dioxide.

As will be further observed from FIGS. 1 and 3, the first main electrode $T_1$ provides a shorting path between $p_2$-region and $n_2$-region. The gate electrode G provides another shorting path between $n_4$-region and $p_2$-region. The two shorting paths are significantly distanced from each other.

Constructed as in the foregoing, the prior art Triac is capable of switching action irrespective of the relative polarities of the potentials of the two main electrodes $T_1$ and $T_2$, and of the polarity of the gate voltage (i.e. the potential of the gate electrode G with respect to that of the first main electrode $T_1$). I will explain such switching action in the following:

Let us consider a first case in which the potential of the second main electrode $T_2$ is positive with respect to that of the first main electrode $T_1$ and in which the potential of the gate electrode G is positive with respect to that of the first main electrode $T_1$. The gate current will then flow through the path comprising the gate electrode G, the $p_2$-region and the first main electrode $T_1$. The result is the conduction of a first thyristor section 4, FIG. 1, of four-layer construction comprising the $p_1$-region, the $n_1$-region, the $p_2$-region and the $n_2$-region. Thus the main current flows from first main electrode $T_2$ to first main electrode $T_1$.

The second case is such that the potential of the second main electrode $T_2$ is positive with respect to that of the first main electrode $T_1$, as in the first case, but that the potential of the gate electrode G is negative with respect to that of the first main electrode $T_1$. The trigger current will then flow through the path comprising the first main electrode $T_1$, the $p_2$-region and the gate electrode G. The result again is the conduction of the first thyristor section 4, with the main current flowing therethrough.

In the third case, the potential of the second main electrode $T_2$ is negative with respect to that of the first main electrode $T_1$, and the potential of the gate electrode G is positive with respect to that of the first main electrode $T_1$. The trigger current will then flow through the path comprising the gate electrode G, the $p_2$-region and the first main electrode $T_1$. Consequently, conduction will take place through a second thyristor section 5 comprising the $n_3$-region, the $p_1$-region, the $n_1$-region and the $p_2$-region. The main current will flow through this second thyristor section 5.

The fourth case is such that the potential of the second main electrode $T_2$ is negative with respect to that of the first main electrode $T_1$, as in the third case, but that the potential of the gate electrode G is negative with respect to that of the first main electrode $T_1$. The trigger current will then flow through the path comprising the first main electrode $T_1$, the $p_2$-region and the gate electrode G. The result will be the same as in the third case, with the main current flowing through the second thyristor section 5.

The reference numeral 6 in FIG. 1 designates an additional section comprised of the $n_4$-region, the $p_2$-region, the $n_1$-region, the $p_1$-region and the $n_3$-region. This section 6 is utilized to cause conduction through the first and second thyristor sections 4 and 5.

One of the problems associated with the Triac is how to achieve a high triggering sensitivity. The triggering sensitivity is defined as the smallness of the gate trigger current needed to cause conduction through the first 4 or second 5 thyristor section. The gate trigger current $I_{GT}$, flowing as a result of the application of a gate voltage between first main electrode $T_1$ and gate electrode G, resolves itself into a first component $I_{GT1}$ flowing through the $p_2$-region under the $n_4$-region, as indicated by the arrow in FIG. 1, and a second component $I_{GT2}$ flowing through the surface portion of the $p_2$-region, as indicated by the arrow in FIG. 3. The achievement of a high triggering sensitivity requires to decrease the magnitude of the second trigger current component $I_{GT2}$ through an increase in the resistivity of its FIG. 3 path.

For the attainment of this objective the prior art Triac is formed to include the noted elongate portion 2 of the $p_2$-region between the $n_2$-and $n_4$-regions. As indicated in FIG. 3, the gate electrode G contacts the $p_2$-region at A adjacent one extremity of the elongate portion 2. The first main electrode $T_1$ contacts the $p_2$-region at B adjacent the other extremity of the elongate portion 2. This arrangement results in the desired increase in the resistivity of the surface portion of the $p_2$-region between gate electrode G and first main electrode $T_1$.

However, it is undesirable to inordinately reduce the width of the elongate portion 2 of the $p_2$-region for increasing the resistivity of the elongate portion 2. The $n_2$-and $n_4$-regions would not be sufficiently electrically separated from each other should the spacing therebetween be reduced too much. My invention succeeds in increasing the resistivity of the surface portion of the $p_2$-region between gate electrode and first main electrode without relying solely on the distance between the $n_2$- and $n_4$-regions, as set forth in detail hereafter in terms of several preferred embodiments.

FIRST FORM

I will now describe my invention in detail as applied to a Triac of the corner gate construction similar to the prior art of FIGS. 1–4. FIGS. 5–9 show a preferable form of Triac according to my invention. Since most parts of this embodiment, and of additional embodiments to be disclosed subsequently, have corresponding parts in the prior art Triac of FIGS. 1–4, I will identify such parts of my invention by the same reference characters used to denote the corresponding parts of the prior art device.

The FIGS. 5–9 Triac is analogous in construction with the FIGS. 1–4 prior art Triac except for the shapes of the $n_4$-region and $p_2$-region and the position of the gate electrode G. I will therefore describe only these differences from the prior art, it being understood that the foregoing description of the prior art substantially applies to the FIGS. 5–9 Triac in the other details of construction.

Figure 5:
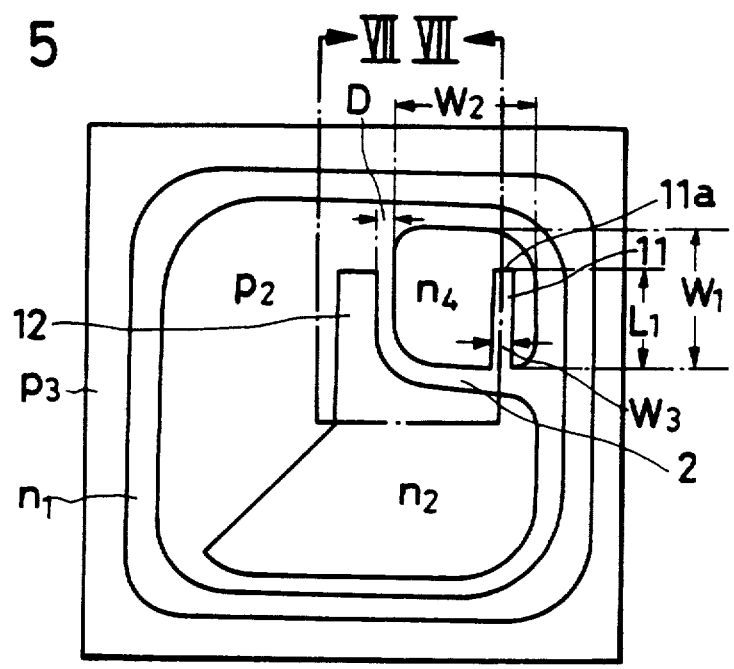
FIG. 5 is a top plan of the semiconductor body of a preferred form of Triac in accordance with my invention.
Figure 6:
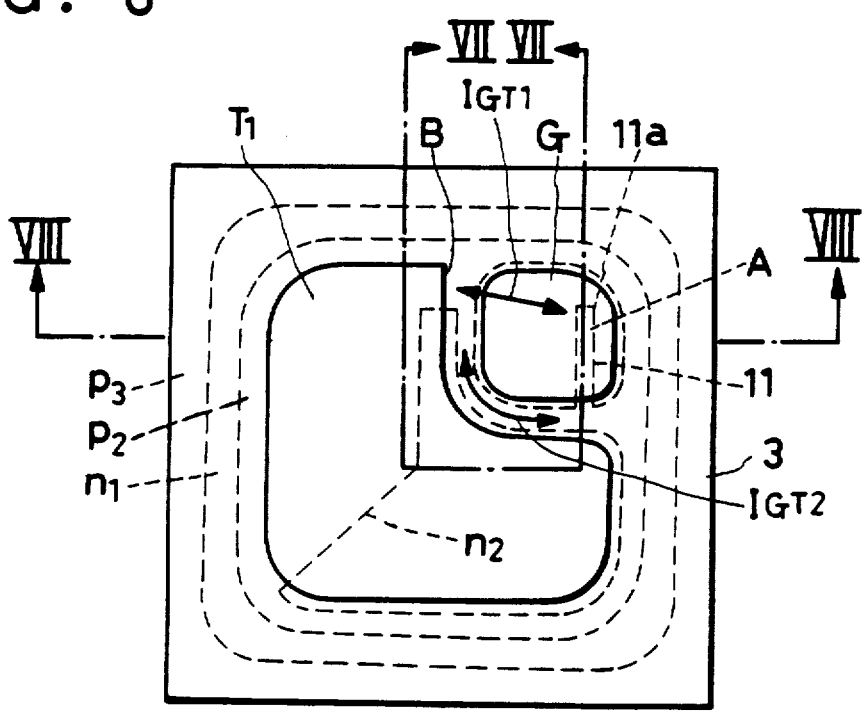
FIG. 6 is a top plan of the FIG. 5 Triac.
Figure 7:
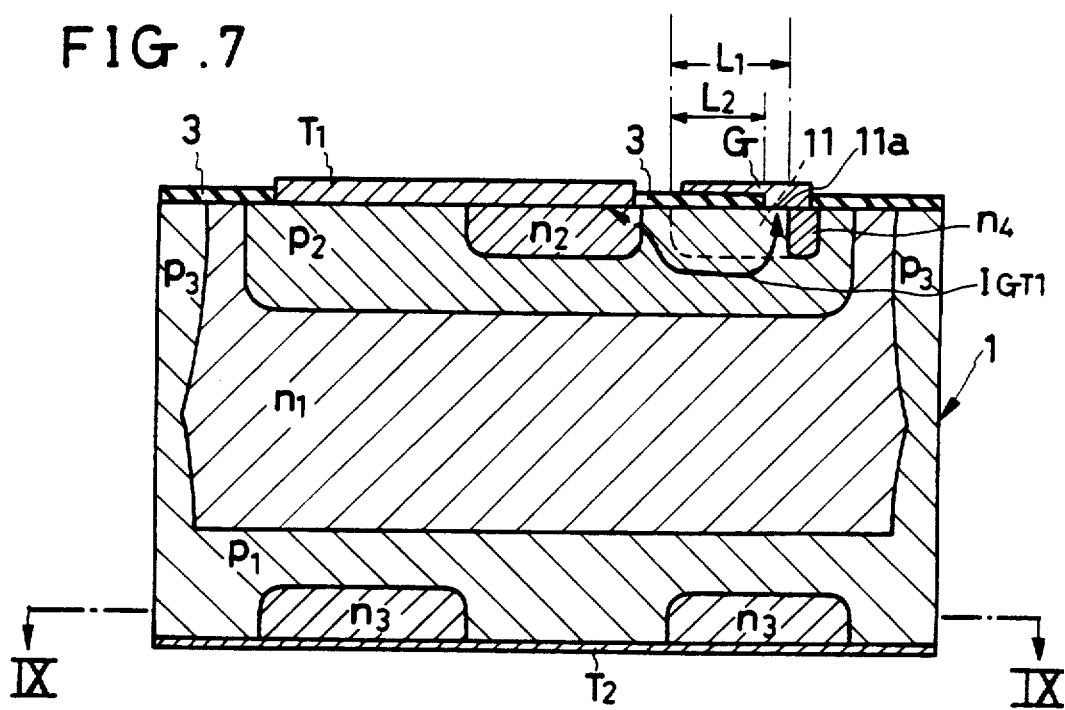
FIG. 7 is a section through the FIG. 5 Triac, taken along the line VII—VII in FIGS. 5, 6 and 9.
Figure 8:
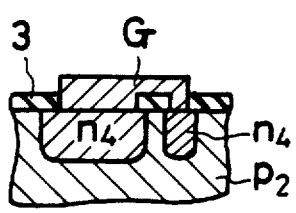
FIG. 8 is a fragmentary section through the FIG. 5 Triac, taken along the line VIII—VIII in FIG. 6.
Figure 9:
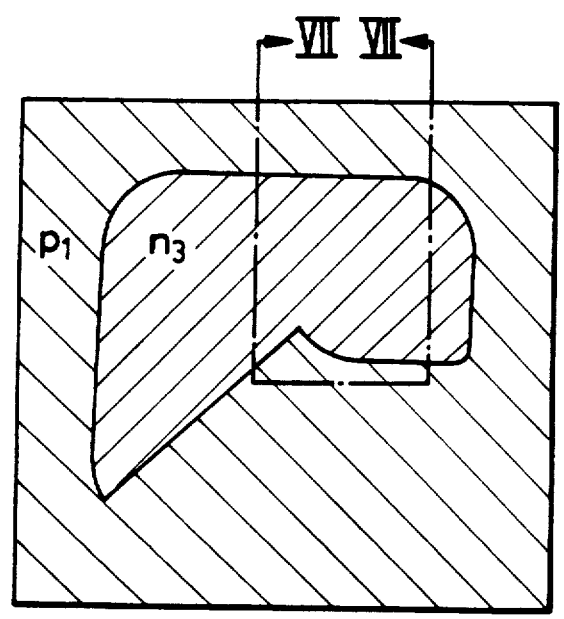
FIG. 9 is a section through the FIG. 5 Triac, taken along the line IX—IX in FIG. 7.

As clearly revealed in FIG. 5, the $n_4$-region has a rather elongate recess of straight shape as seen in this figure. FIG. 7 also indicates that the recess extends throughout the $n_4$-region in the top-to-bottom depth direction of the semiconductor body 1. This recess is filled up by a peninsular filling portion 11 of the $p_2$-region in accordance with a feature of my invention. Actually, the peninsular filling portion 11 can be formed by a simple masking of the $p_2$-region in forming the recessed $n_4$-region therein by impurity diffusion. FIG. 8 indicates that the peninsular filling portion 11 extends throughout the depth of the $n_4$-region.

The open end, shown directed downwardly in FIG. 5, of the elongate recess in the $n_4$-region is disposed adjacent the right hand end of the elongate portion 2 of the $p_2$-region in order to utilize not only the elongate portion 2 but also the peninsular filling portion 11 as a path for the aforesaid second component $I_{GT2}$ of the gate trigger current $I_{GT}$. In other words, the elongate recess in the $n_4$-region is formed along its right hand edge.

For the best results, the length $L_1$ of the peninsular filling portion 11 is about 5/7 of the dimension $W_1$ of the $n_4$-region in the longitudinal direction of the recess. The width $W_3$ of the peninsular filling portion 11 is about 1/7 of the dimension $W_2$ of the $n_4$-region in the transverse direction of the recess. Typically, $W_1$ is 660 micrometers; $W_2$ 660 micrometers; $W_3$ 60 micrometers; and $L_1$ 500 micrometers. The distance D between $n_2$-region, or the width of the elongate portion 2 of the $p_2$-region, is 80 micrometers.

As will be seen from FIGS. 5 and 7, all but the distal end portion 11a of the peninsular filling portion 11 of the $p_2$-region is covered by the insulating film 3. By the distal end portion 11a I mean that portion of the peninsular filling portion 11 which is received at the closed end portion of the elongate recess in the $n_4$-region. Also, as will be understood from FIG. 7 taken together with FIG. 6, the gate electrode G covers most of the $n_4$-region and all of the peninsular filling portion 11 but makes direct contact with the latter only at its distal end portion 11a. Accordingly, the peninsular portion 11 of the $p_2$-region serves as a path for the mentioned second component $I_{GT2}$ of the gate trigger current.

FIG. 7 indicates at $L_2$ the length of that part of the peninsular filling portion 11 which is covered by the insulating film 3 and so is out of contact with the gate electrode G. The gate electrode G contacts the remaining distal end portion 11a of the peninsular filling portion 11. Typically, $L_2$ is 375 micrometers. Since the length $L_1$ of the peninsular filling portion 11 is 500 micrometers, the gate electrode G is out of contact with ¾ of the length of the peninsular filling portion in this particular embodiment. Speaking more broadly, however, $L_2$ can be equal to or greater than approximately ⅓ of $L_1$ for the effective reduction of the magnitude of the second component $I_{GT2}$ of the trigger current. In other words, the length of the distal end portion 11a, which is in contact with the gate electrode G, of the peninsular filling portion is less than approximately ⅔ of the length $L_1$ of the peninsular filling portion 11.

In summary, according to the Triac of FIGS. 5–9, the peninsular filling portion 11 in the elongate recess in the $n_4$-region serves to increase the resistivity of the surface portion of the $p_2$-region between gate electrode G and first main electrode $T_1$. As the second component $I_{GT2}$ of the trigger current decreases in magnitude, so does the total trigger current needed for the switching action of the Triac. A high triggering sensitivity at low trigger currents is thus achieved. It will also be appreciated that the peninsular filling portion 11 does not affect the required electrical separation between $n_2$-region and $n_4$-region as only the $n_4$-region is recessed to receive the peninsular filling portion of the $p_2$-region.

SECOND FORM

FIGS. 10-14 illustrate a second preferred form of Triac according to my invention. This Triac features an insular filling portion 8 of the $p_2$-region employed in substitution for the peninsular filling portion 11 of the FIGS. 5-9 embodiment. Circular in shape as seen in a plan view as in FIGS. 11 and 12, the insular filling portion 8 extends through the $n_4$-region in the top-to-bottom depth direction of the semiconductor body 1 as in FIG. 10. The insular filling portion 8 can be formed merely by masking the $p_2$-region in forming the recessed $n_4$-region by the diffusion of an impurity substance in the $p_2$-region.

The gate electrode G covers substantially all the exposed surface of the $n_4$-region and, of course, the exposed surface of the insular filling portion 8. The edge of the insulating film 3 bounding the opening 3b, through which the gate electrode G contacts the $n_4$-region and insular filling portion 8, is disposed somewhat inwardly of the boundary of the $n_4$-region, as illustrated in FIGS. 10 and 12, in order to prevent the gate electrode G from contacting the $p_2$-region at the periphery of the $n_4$-region.

Figure 10:
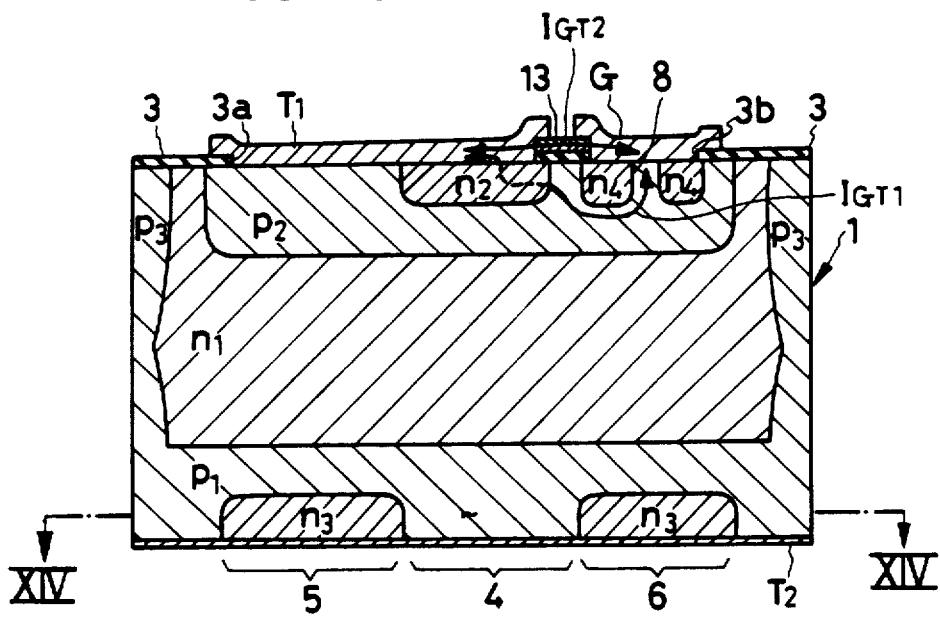
FIG. 10 is a section through another preferred form of Triac in accordance with my invention, taken along the line X—X in FIGS. 11, 12 and 14.
Figure 12:
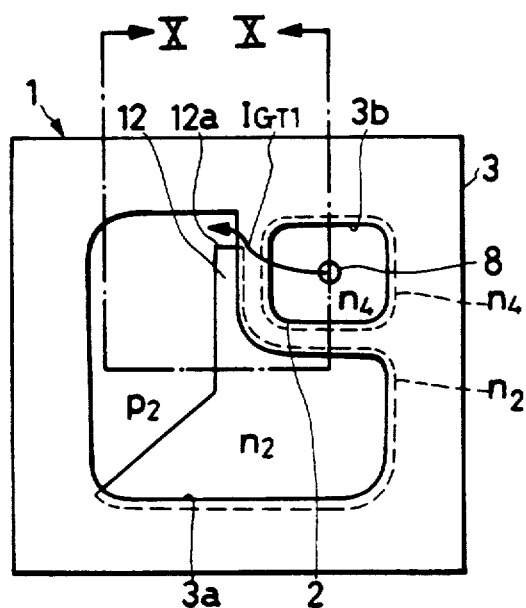
FIG. 12 is a view similar to FIG. 11 except that the semiconductor body is shown with an apertured insulating film formed thereon.
Figure 13:
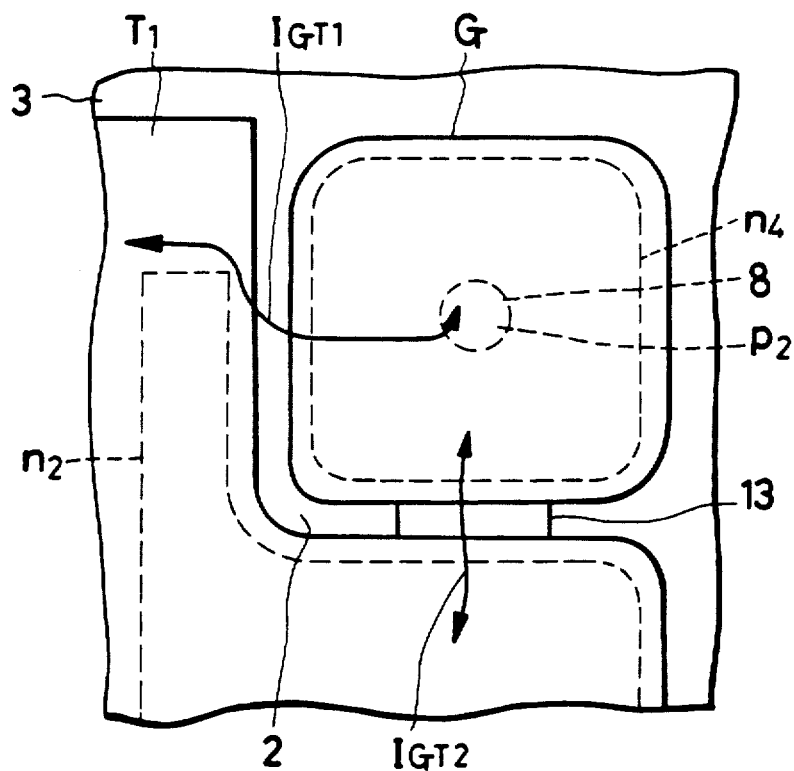
FIG. 13 is an enlarged, fragmentary top plan of the FIG. 10 Triac.
Figure 14:
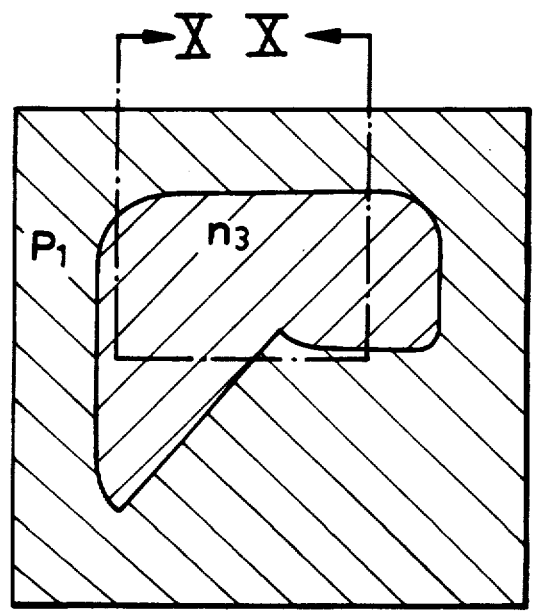
FIG. 14 is a section through the FIG. 10 Triac, taken along the line XIV—XIV in FIG. 10.

FIGS. 10 and 12 also show the opening 3a in the insulating film 3 through which the first main electrode $T_1$ contacts the $p_2$-region and $n_2$-region. The right hand and bottom boundaries, as viewed in FIG. 12, of this opening 3a are disposed inwardly of the right hand and bottom edges of the $n_2$-region. Consequently, the first main electrode $T_1$ is not to extend beyond the right hand and bottom extremities of the $n_2$-region into contact with the $p_2$-region.

Figure 11:
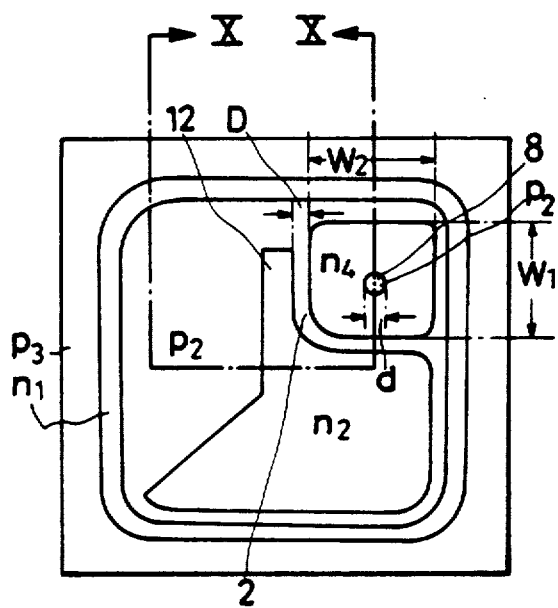
FIG. 11 is a top plan of the semiconductor body of the FIG. 10 Triac.

Typically, as indicated in FIG. 11, the dimensions $W_1$ and $W_2$ of the $n_4$-region are the same in this embodiment, being both 240 micrometers. The distance D between $n_2$-region and $n_4$-region is 70 micrometers. The diameter d of the insular filling portion 8 is also 70 micrometers.

This second embodiment also features a resistive region, seen at 13 in FIG. 10, which has a negative temperature coefficient and which is formed on the elongate portion 2 of the $p_2$-region via the insulating film 3. The resistive region 13 can be fabricated from materials composed principally of polycrystalline silicon by the familiar chemical vapor deposition method. Normally, for the production of the resistive region 13, a polycrystalline silicon layer may first be formed on the complete surface of the insulating film 3 on the semiconductor body 1. Then the resistive region 13 may be left by etching away the rest of the silicon layer. Subsequently, the first main electrode $T_1$ and gate electrode G may be formed after creating the openings 3a and 3b in the insulating film 3 by etching as in FIG. 12.

Figure 15:
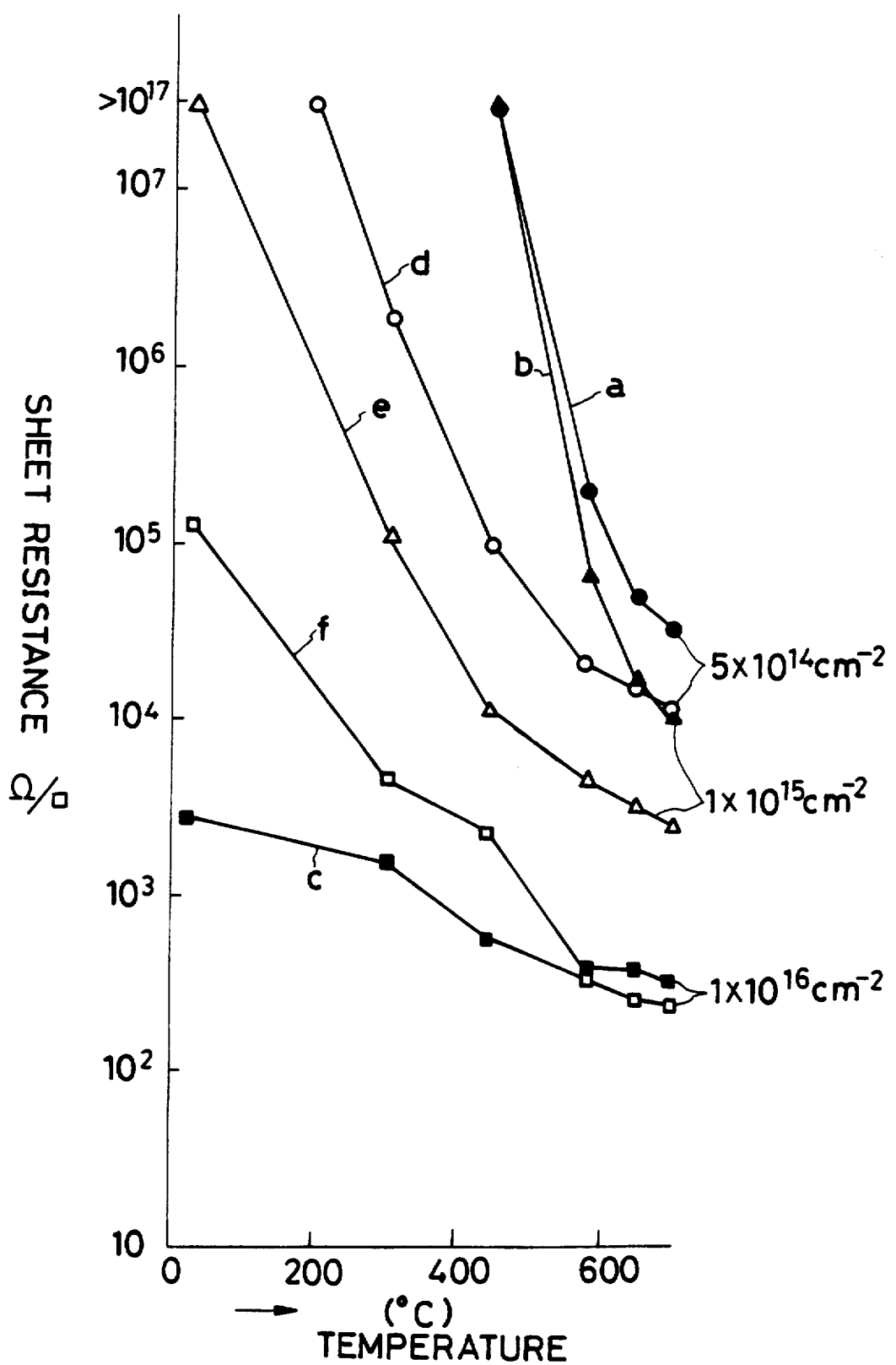
FIG. 15 is a graph plotting the curves of the sheet resistances of some polycrystalline silicon compositions against temperature, the silicon compositions being suitable for use as materials of the resistive region of the FIGS. 10–14 Triac.

FIG. 15 graphically represents the negative temperature characteristics (changes in sheet resistance with temperature) of some polycrystalline silicon compositions that can be used for the fabrication of the resistive region 13. The curves a, b and c in this graph represent the characteristics of polycrystalline silicon containing $5 \times 10^{14}$ atoms per square centimeter (atoms/cm$^2$), $1 \times 10^{15}$ atoms/cm$^2$ and $1 \times 10^{16}$ atoms/cm$^2$, respectively, of phosphorus as an impurity substance. The curves d, e and f represent the characteristics of polycrystalline silicon containing $5 \times 10^{14}$ atoms/cm$^2$, $1 \times 10^{15}$ atoms/cm$^2$ and $1 \times 10^{16}$ atoms/cm$^2$, respectively, of boron as an impurity substance.

It will be seen from the graph of FIG. 15 that all the listed substances exhibit negative temperature characteristics in the normal range of temperatures in which the Triac will be put to use. It will also be appreciated that the resistivity of the resistive region 13 is variable at will by changing the kind and/or concentration of the impurity substance to be introduced into polycrystalline silicon.

The FIGS. 10-14 Triac is akin to the FIGS. 5-9 device in the other details of construction.

The advantages gained by the FIGS. 10-14 Triac will become better understood by first studying its operation in the absence of the resistive region 13. The trigger current would then wholly flow through the $p_2$-region under the $n_4$-region and through the insular filling portion 8 of the $p_2$-region. The mentioned second component $I_{GT2}$ of the trigger current would be zero, with the consequent increase in triggering sensitivity.

Figure 16:
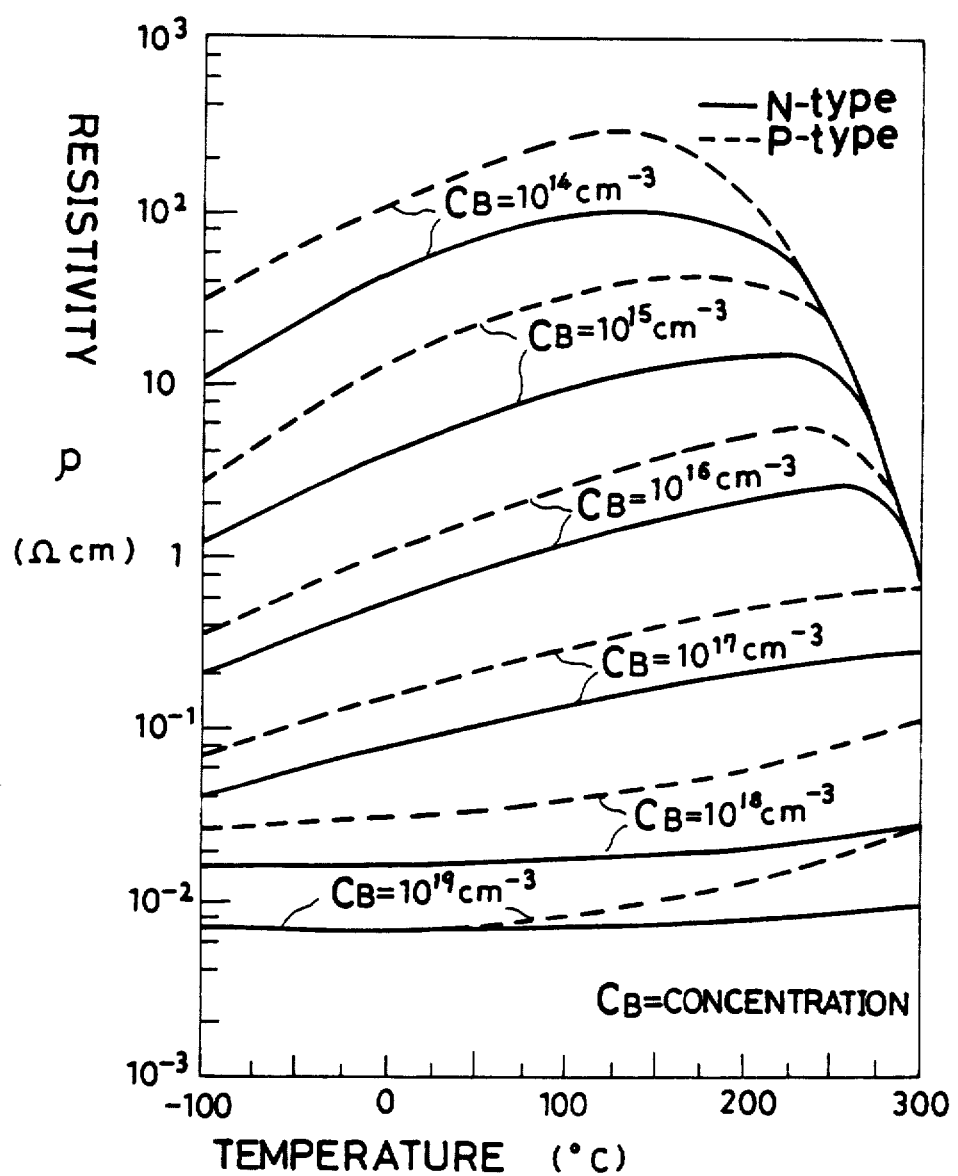
FIG. 16 is a graph plotting the curves of the resistivities of some semiconductors against temperature, the graph being useful in explaining the temperature dependence of the trigger action of the FIGS. 10-14 Triac.

However, a problem would arise if the resistive region 13 were absent from the FIGS. 10-14 Triac. Usually, the impurity concentration (e.g. $10^{15}$-$10^{16}$ atoms/cm$^3$) of the $p_2$-region portion underlying the $n_4$-region is much lower than that (e.g. $10^{17}$-$10^{18}$ atoms/cm$^3$) of the surface portion of the $p_2$-region. The low impurity concentration of the $p_2$-region portion under the $p_4$-region makes its resistivity more temperature-dependent. This fact is evidenced by the graph of FIG. 16 which plots the curves of the resistivities of some semiconductors against temperature. Therefore, should the resistive region 13 be absent from the FIGS. 10-14 Triac, the magnitude of its gate trigger current would vary greatly with temperature.

The resistive region 13 of a negative temperature coefficient is designed to overcome this temperature dependence of the gate trigger current. With the resistive 13 connected between gate electrode G and first main electrode $T_1$, the resistance between these electrodes is the sum of the value of the resistive region 13 and the value of the "internal resistance" of the $p_2$-region to the first component $I_{GT1}$ of the trigger current. The internal resistance of the $p_2$-region has a positive temperature coefficient whereas the resistive region 13 has a negative temperature coefficient. Consequently, the total resistance between gate electrode G and first main electrode $T_1$ becomes practically constant regardless of temperatures.

It will therefore be understood that the FIGS. 10-14 Triac offers two primary advantages. One is a high triggering sensitivity at low trigger currents, as in the first described embodiment. The other is the elimination of the temperature dependence of the triggering sensitivity.

MODIFICATIONS

I have illustrated in FIGS. 17-20 some modifications of the foregoing embodiments which I believe all fall within the scope of my invention.

Figure 17:
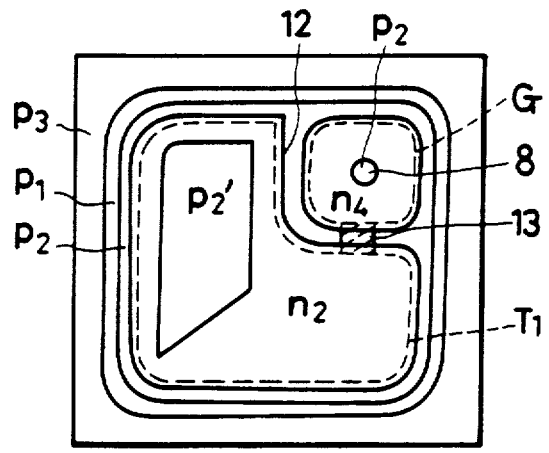
FIG. 17 is a top plan of the semiconductor body of still another preferred form of Triac in accordance with my invention.

In one such modification shown in FIG. 17, the $n_2$-region is formed within the $p_2$-region as in the foregoing embodiments but has a larger surface area exposed at the top of the semiconductor body. Further the $n_2$-region is apertured to receive an insular portion $p_2'$ of the $p_2$-region. This insular portion $p_2'$ of the $p_2$-region is intended for contact with the first main electrode $T_1$.

Figure 18:
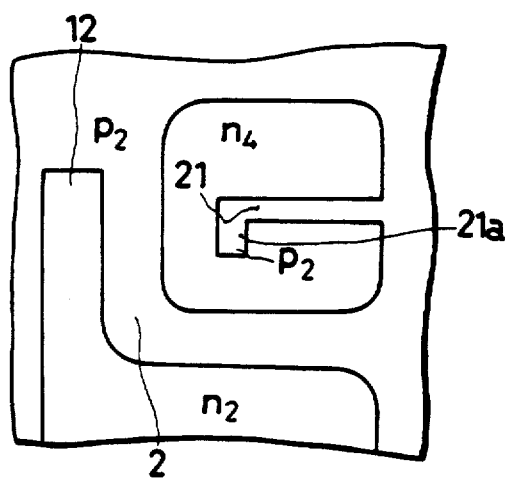
FIG. 18 is a fragmentary top plan of the semiconductor body of a further preferred form of Triac in accordance with my invention.

FIG. 18 shows an L-shaped peninsular filling portion 21 as a modification of the straight peninsular filling portion 11 of the FIGS. 5-9 embodiment. The L-shaped peninsular portion 21 largely extends from the right hand edge, as viewed in these figures, of the $n_4$-region and has a distal end portion 21a bent downwardly, also as seen in these figures. The gate electrode G may be placed in contact only with the distal end portion 21a of the L-shaped peninsular filling portion 21, with the exposed surface of the rest of the peninsular filling portion covered with the insulating film 3, as in the FIGS. 5-9 embodiment.

Figure 19:
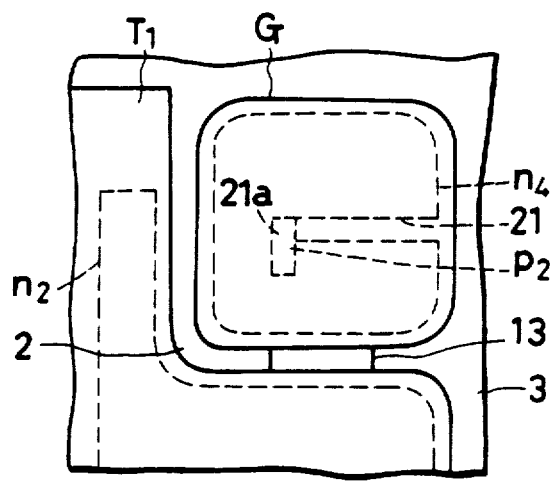
FIG. 19 is a fragmentary top plan of a further preferred form of Triac in accordance with my invention.

As illustrated in FIG. 19, the L-shaped peninsular filling portion 21 may be employed in combination with the resistive region 13 connected between gate electrode G and first main electrode $T_1$ as in the FIGS. 10-14 embodiment. With this arrangement the gate trigger current resolves itself into three components, with the first component flowing inside the $p_2$-region, the second flowing through the surface portion of the $p_2$-region, and the third flowing through the resistive region 13.

Figure 20:
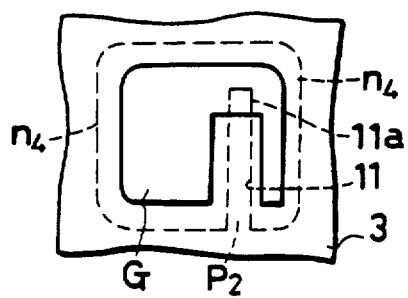
FIG. 20 is a fragmentary top plan of a still further preferred form of Triac in accordance with my invention.

The gate electrode G may be shaped and sized to overlie only the $n_4$-region and the distal end portion 11a of the peninsular filling portion 11, as shown in FIG. 20.

Additional modifications or alterations of the illustrated embodiments will suggest themselves to those skilled in the art within the broad teaching hereof. For example, a high-concentration p-type guard ring or equipotential ring may be provided to the $p_2$-region or to the $p_3$-region or to both. Further, the first main electrode $T_1$ and gate electrode G may be made from polycrystalline silicon. Still further, the principles of my invention may be applied to Triacs of other than the exemplified corner gate construction, such as center-gate and side-gate Triacs.

What I claim is:

1. A bidirectional triode thyristor comprising:
   (a) a semiconductor body having first and second opposite surfaces and comprising:
   (1) a first region ($n_1$) of a first conductivity type within the semiconductor body;
   (2) a second region ($p_1$) of a second conductivity type, opposite to the first conductivity type, contiguously disposed on a first side of the first region ($n_1$) and exposed at the first surface of the semiconductor body;
   (3) a third region ($p_2$) of the second conductivity type contiguously disposed on a second side, opposite to the first side, of the first region ($n_1$) and exposed at the second surface of the semiconductor body, the filling portion of the third region ($p_2$) being peninsular in shape as seen on the second surface of the semiconductor body, the peninsular filling portion having a distal end portion away from the third region ($p_2$) as seen on the second surface of the semiconductor body, the length of the distal end portion of the filling portion being less than about ⅔ of the length of the peninsular filling portion;
   (4) a fourth region ($n_2$) of the first conductivity type formed in the third region ($p_2$) and exposed at the second surface of the semiconductor body;
   (5) a fifth region ($n_4$) of the first conductivity type formed in the third region ($p_2$) and isolated from the fourth region ($n_2$), the fifth region being exposed at the second surface of the semiconductor body, the fifth region ($n_4$) having the exposed surface area less than the exposed surface area of the fourth region ($n_2$);
   (6) a sixth region ($n_3$) of the first conductivity type formed in the second region ($p_1$) and exposed at the first surface of the semiconductor body;
   (7) there being a recess formed in the fifth region ($n_4$) so as to extend therethrough in a direction normal to the first and second opposite surfaces of the semiconductor body; and
   (8) the third region ($p_2$) having a filling portion filling the recess in the fifth region, the filling portion being exposed at the second surface of the semiconductor body;
   (b) a first main electrode ($T_1$) formed on of the second surface of the semiconductor body and contacting the third region ($p_2$) and the fourth region ($n_2$);
   (c) a second main electrode ($T_2$) formed on the first surface of the semiconductor body and contacting the second region ($p_1$) and the sixth region ($n_3$); and
   (d) a gate electrode (G) formed on the second surface of the semiconductor body and contacting the fifth region ($n_4$) and the filling portion of the third region ($p_2$), the gate electrode contacting only with the distal end portion of the filling portion.

2. The bidirectional triode thyristor of claim 1 wherein all but the distal end portion of the peninsular filling portion is covered by an insulating film formed on the second surface of the semiconductor body.

3. The bidirectional triode thyristor of claim 1, wherein the peninsular filling portion is straight in shape as seen on the second surface of the semiconductor body.

4. The bidirectional triode thyristor of claim 1 wherein the peninsular filling portion is L shaped as seen on the second surface of the semiconductor body.

5. The bidirectional triode thyristor of claim 1 further comprising a resistive region interconnecting the first main electrode and the gate electrode, the resistive region having a negative temperature coefficient.

6. The bidirectional triode thyristor of claim 5 wherein the resistive region is made from polycrystalline silicon.

7. The bidirectional triode thyristor of claim 1 further comprising an insulating film formed on the second surface, the insulating film having an opening through which the first main electrode contacts the third and fourth regions, and another opening through which the gate electrode contacts the third and fifth regions.

8. The bidirectional triode thyristor of claim 7 further comprising a resistive region of polycrystalline silicon formed on the insulating film so as to interconnect the first main electrode and the gate electrode.

9. The bidirectional triode thyristor of claim 1 wherein the third region ($p_2$) is approximately rectangular in shape as seen on the second surface of the semiconductor body, wherein the fifth region ($n_4$) is disposed adjacent one corner of the third region, and wherein an elongate portion of the third region ($p_2$) is formed between the fourth region ($n_2$) and the fifth region ($n_4$).

10. The bidirectional triode thyristor of claim 1 wherein the third region ($p_2$) is formed to include an insular portion ($p_2'$) surrounded by the fourth region ($n_2$), the insular portion ($p_2'$) of the third region being exposed at the second surface of the semiconductor body for contact with the first main electrode.

11. A bidirectional triode thyristor comprising:
   (a) a semiconductor body having first and second opposite surfaces and comprising:
      (1) a first region ($n_1$) of a first conductivity type within the semiconductor body;
      (2) a second region ($p_1$) of a second conductivity type, opposite to the first conductivity type, contiguously disposed on a first side of the first region ($n_1$) and exposed at the first surface of the semiconductor body;
      (3) a third region ($p_2$) of the second conductivity type contiguously disposed on a second side, opposite to the first side, of the first region ($n_1$) and exposed at the second surface of the semiconductor body, the filling portion of the third region ($p_2$) being insular in shape as seen on the second surface of the semiconductor body;
      (4) a fourth region ($n_2$) of the first conductivity type formed in the third region ($p_2$) and exposed at the second surface of the semiconductor body;
      (5) a fifth region ($n_4$) of the first conductivity type formed in the third region ($p_2$), the fifth region being exposed at the second surface of the semiconductor body;
      (6) a sixth region ($n_3$) of the first conductivity type formed in the second region ($p_1$) and exposed at the first surface of the semiconductor body;
      (7) there being a recess formed in the fifth region ($n_4$) so as to extend therethrough in a direction normal to the first and second opposite surfaces of the semiconductor body; and
      (8) the third region ($p_2$) having a filling portion filling the recess in the fifth region, the filling portion being exposed at the second surface of the semiconductor body;
   (b) a first main electrode ($T_1$) formed on the second surface of the semiconductor body and contacting the third region ($p_2$) and the fourth region ($n_2$);
   (c) a second main electrode ($T_2$) formed on the first surface of the semiconductor body and contacting the second region ($p_1$) and the sixth region ($n_3$);
   (d) a gate electrode (G) formed on the second surface of the semiconductor body and contacting the fifth region ($n_4$) and the filling portion of the third region ($p_2$);
   (e) an insulating film formed on the second surface, the insulating film having an opening through which the first main electrode ($T_1$) contacts the third ($p_2$) and fourth ($n_2$) regions, and another opening through which the gate electrode (G) contacts the third ($p_2$) and fifth ($n_4$) regions; and
   (f) a resistive region formed on the insulating film so as to interconnect the first main electrode ($T_1$) and the gate electrode (G), the resistive region having a negative temperature coefficient.

* * * * *